United States Patent [19]

Fox et al.

[11] Patent Number: 5,083,087
[45] Date of Patent: Jan. 21, 1992

[54] BROKEN WIRE DETECTOR FOR WIRE SCRIBING MACHINES

[75] Inventors: James M. Fox, Kings Park; Howard F. Malone, Southold, both of N.Y.

[73] Assignee: Advanced Interconnection Technology, Inc., Islip, N.Y.

[21] Appl. No.: 554,130

[22] Filed: Jul. 17, 1990

[51] Int. Cl.⁵ .................... G01R 31/02; B32B 31/00
[52] U.S. Cl. ................... 324/537; 324/555; 156/378
[58] Field of Search ............ 324/683, 500, 519, 520, 324/521, 537, 555, 686, 658; 29/593; 156/378, 379.6, 379.7; 228/4.5

[56] References Cited

U.S. PATENT DOCUMENTS

| | | | |
|---|---|---|---|
| 3,674,602 | 7/1972 | Keogh et al. | 156/380 |
| 3,674,914 | 7/1972 | Burr | 174/68.5 |
| 3,778,707 | 12/1973 | Vogel | 324/683 X |
| 3,959,723 | 5/1976 | Wagner | 324/683 X |
| 3,975,680 | 8/1976 | Webb | 324/61 P |
| 4,485,957 | 12/1984 | Sugimoto et al. | 228/4.5 |
| 4,565,966 | 1/1986 | Burr et al. | 324/73 PC |
| 4,583,042 | 4/1986 | Riemer | 324/537 X |
| 4,586,642 | 5/1986 | Dreibelbis et al. | 228/104 X |
| 4,641,773 | 2/1987 | Morino et al. | 228/1.1 |
| 4,693,778 | 9/1987 | Swiggett et al. | 151/361 |

Primary Examiner—Jack B. Harvey
Attorney, Agent, or Firm—Morgan & Finnegan

[57] ABSTRACT

An apparatus for detecting breaks in wire while the wire is being scribed wherein the apparatus measures changes, in real time, in the scribing system's electrical characteristics. These characteristics can be changes in phase shift and capacitance variations caused by breaks in the wire as the wire is scribed onto a workpiece.

20 Claims, 4 Drawing Sheets

BROKEN WIRE DETECTOR FOR WIRE SCRIBING MACHINES

FIELD OF THE INVENTION

This invention relates generally to apparatus for detecting breaks in wire while the wire is being scribed and more specifically, to apparatus for measuring changes, in real time, in a scribing system's electrical characteristics, such as phase shift and capacitance variation, caused by breaks in the wire as the wire is scribed on a workpiece.

BACKGROUND OF THE INVENTION

Since its inception, the technology of writing with wire (scribing) has improved dramatically in the areas of quality, performance and most significantly, density. For example, in the 1970's 6.3 mil wire was the standard size allowing for densities up to 40 inches of conductor per square inch. In the early 1980's 4 mil wire, which allowed for a density of up to 80 inches of conductor per square inch, was becoming accepted in the marketplace. As of the late 1980's densities of up to 160 inches of conductor per square inch were possible with the use of 2.5 mil wire. For the most part, these density improvements have been motivated by the market's need for smaller and more powerful computers and by the availability of more sophisticated integrated circuits.

The basic scribed wire technique is described in U.S. Pat. No. 3,674,914 to Burr. The insulated wire, as it is written or scribed, is fixed or tacked by a heat sensitive, adhesive surface on the substrate by means of a scribing or tacking head. The head guides the wire and heats or energizes the sensitive surface as the wire is brought into engagement. The preferred technique for tacking the scribed wire is through the use of ultrasonic energy. The wire passes beneath a grooved stylus which is used to position the wire. Ultrasonic energy is applied to the stylus to activate the adhesive layer beneath the wire and to push the wire into the adhesive layer. After the tacked or scribed wire pattern is complete on the board surface, the pattern is fixed by coating the board with an encapsulating layer. Thereafter, holes are drilled in the board at the conductor run terminations and the holes are plated to provide for surface connections to electronic components.

In recent times the electronics industry has moved toward more compact integrated circuit packages with surface-mounted terminals. In the new packaging the distance between adjacent edge connections is 20 mil or less. Not only are the connection points closer together, but the density of the wiring pattern must also be substantially increased. In order to achieve the increased density the wire size must be finer and is preferably 42 AWG wire with a 2.5 mil diameter. The hole diameter of the surface terminals is preferably reduced to about 8 mil and achieved through laser drilling.

Each improvement, however, was accompanied by technical challenges that had to be overcome in order to maintain production efficiency and product quality. These challenges have been addressed in three major areas of design, materials, and machinery enhancements. However, some manufacturing system defects still persist. For example, to date visual inspection during the scribing operation has been the only way to determine wiring quality and integrity in real time prior to completion of the circuit board. This visual inspection is not only time consuming and labor intensive, but is also completely unreliable given the extremely small, state-of-the-art, 2.5 mil wire and the dense layered construction of state-of-the-art circuit boards.

One common defect that eludes timely detection with the present inspection techniques has been unintentional breaks in the scribed wire. The incidence of unintentional breakage increases as the diameter of the wire used decreases. Conventional technology allows a manufacturer to electronically inspect and test the product after it is completed. Obviously, if there have been any irregularities produced during the scribing process, nothing can be done but to dispose of the board. Considering the cost increase in producing higher density boards, faults or irregularities can become extremely wasteful and time consuming. Some examples of prior art patents that have attempted to test the board after the product is completed are represented on U.S. Pat. No. 3,975,680 (Webb, 1976), and in U.S. Pat. No. 4,565,966 (Burr et al., 1986).

Alternatively, the manufacturing process could be interrupted at predetermined intervals during which the boards are inspected electronically. This type of periodic evaluation, however, results in an increase in the production time for each circuit board making the process inefficient.

OBJECTS OF THE INVENTION

It is, therefore, an object of the present invention to define apparatus for detecting unintentional wire breaks during wire scribing of a circuit board in real time.

It is a further object of this invention to provide an apparatus for continuously monitoring the electrical characteristics of a workpiece while the wire is being installed on the workpiece.

Another object of the invention is to provide apparatus which will terminate the wire scribing process when an unintentional break is detected.

Another object of the present invention is to provide apparatus to improve the reliability and efficiency of circuit board fabrication.

A further object of this invention is to provide apparatus for monitoring the relative electrical characteristics of a scribing system while the wire is being scribed and to terminate the process if an unintentional break occurs.

SUMMARY OF THE INVENTION

The present invention provides apparatus that will detect unintentional breaks in a scribed wire by electrically monitoring the workpiece for unplanned changes in phase shift or capacitance. In a preferred embodiment, the apparatus can be incorporated on existing wire scribe machines.

Since both the insulating material on the wire as well as the material in a circuit board are dielectrics, a capacitance is created between the wire being bonded down and any ground plate below it. As the length of the scribed wire increases, the capacitance changes. This change in the capacitance can be used to determine in real time as the wire is being scribed, if a break in a wire has occurred.

The apparatus includes a device that measures the relative electrical characteristics of the wire and the workpiece as it is being scribed. The measuring device is in constant electrical contact with the wire even though the wire may still move freely through the contact point as the device conducts its measurements.

The workpiece that the wire is scribed to is grounded through its connection to a ground plate, either in the panel on which the workpiece rests or on the machine table's shuttle plate. The completed circuit includes the measuring device in contact with the wire that is scribed on the grounded workpiece and is connected to the measuring device.

The invention also provides a process for detecting breaks in a wire during wire scribing activities. The monitoring of the wire is continual in time as the wire is being scribed. The process includes measuring the wire's electrical qualities while the wire is moving through a connection. The connection should be located at a point before the wire is attached to the workpiece. The process also includes grounding the workpiece and the measuring device, such that an electrical loop including grounding, the measuring device, the wire, and the workpiece complete an electrical circuit. Thereafter, the electrical qualities of the wire are measured as the wire is scribed on the workpiece. If there is an unexpected change in the electrical qualities measured in the wire, an indication is given and the scribing process is terminated. Otherwise, when the scribed wire indicates a desired capacitance, or other electrical quality, the scribing process may continue.

BRIEF DESCRIPTION OF THE DRAWINGS

The above and other objects, features, and advantages of this invention will be apparent in the following detailed description of the preferred embodiments, especially when taken in conjunction with the accompanying drawings wherein.

DETAILED DESCRIPTION OF THE PREFERRED EMBODIMENTS

Figure 1:
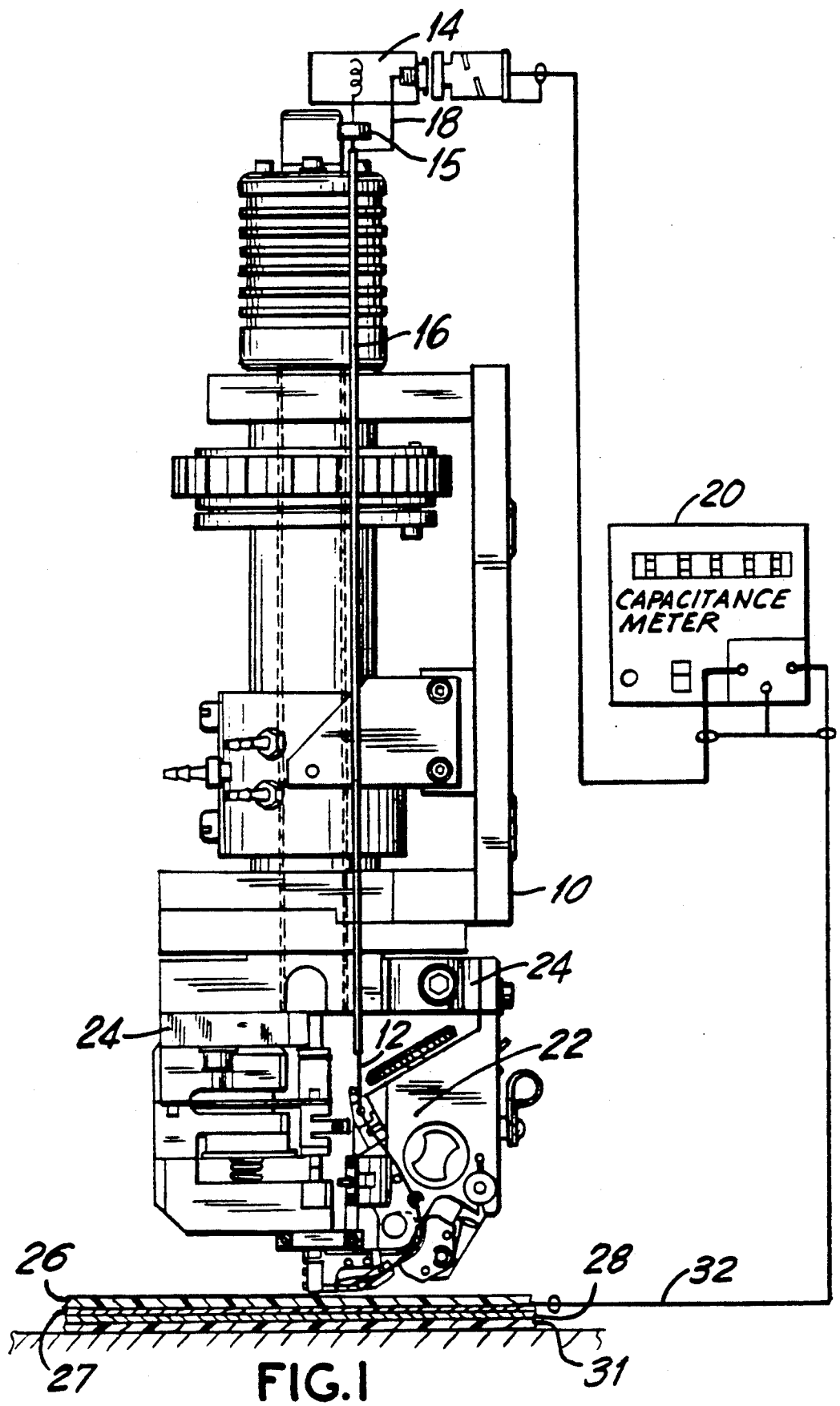
FIG. 1 is a side view in partial cross-section of the scribing head and the components that encompass the electrical circuit monitoring the capacitance of the wire.

Referring now to drawings, and in particular to FIG. 1, the apparatus of the invention is incorporated into the head of a scribing machine 10 as described in U.S. Pat. No. 4,641,773 Morino et. al., issued on Feb. 10, 1987 and incorporated herein by reference. Although a specific scribe machine head is shown, any device that can write wire would be acceptable.

The wire 12 is fed from a supply source 14 and passed through a ferrite ring 15 to a conductive tube 16, which is electrically insulated from the rest of the scribing device. Ring 15 electrically isolates wire 12 from source 14.

In the embodiment explained herein tube 16 is a brass tube. Wire 12 passes through brass tube 16 which is internally insulated. The combination of wire 12, internal insulation of brass tube 16, and surface conduction of brass tube 16 creates a capacitance in the system. The system comprises the entire assembly whose capacitance can be measured.

Attached to the outside brass tube 16 is an electrical lead 18 that connects tube 16 to a capacitance meter 20. Capacitance meter 20 can be of any make and of the range necessary for the purpose addressed below. In the depicted arrangement, the meter used is a Boonton 72B digital capacitance meter operating at a frequency of 1 MHz and at a voltage of 15 mV.

After wire 12 exits brass tube 16, it is fed through the feeding mechanism 22 of the scribing machine. Feeding mechanism 22 is electrically insulated from the remaining portion of scribing head 10 by insulated blocks 24.

During the scribing process, wire 12 is affixed to a workpiece 26. A capacitance exists between the wire and the ground plane. This capacitance, or variations thereof, can be measured by a capacitance meter. Workpiece 26 rests on a panel with a metal panel 27 and is electrically connected with it. Panel 27 is affixed to a shuttle plate 28. Shuttle plate 28 move workpiece 26 and panel 27 and is electrically isolated from the scribing machine's supporting frame by an insulating layer 31.

Shuttle plate 28 is connected to meter 20 by electrical lead 32. Alternatively, lead 32 could also be connected to plane 27.

Figure 2:
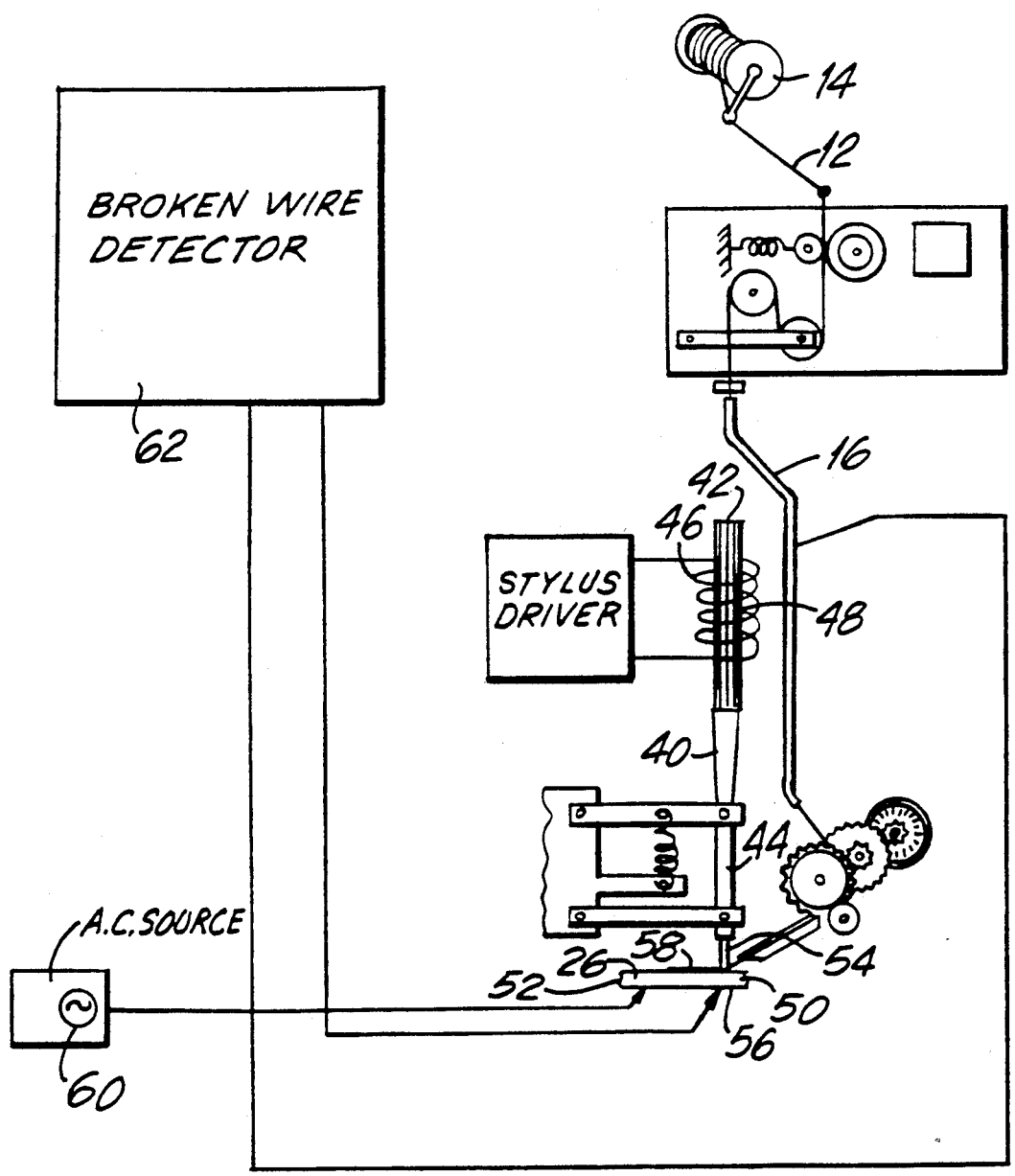
FIG. 2 shows one embodiment of this invention where the connection to the scribing wire is made capacitively.

FIG. 2 represents the major elements of this invention in further detail. Stylus 40 is generally shaped as shown in FIG. 2 including a magnetostrictive transducer 42 coupled to a tapered horn 44. Transducer 42 is made from a material having magnetostrictive properties, such as nickel, and is surrounded by a driving coil 46. The nodal point 48 at the center of transducer 42 is stationery, and the ends of the transducer vibrate in longitudinal direction.

Insulated wire 12 is dispersed from a spool 14 and is supplied to the surface of the workpiece or a circuit board 26 via a wire feed drive system. The circuit board includes the substrate 50 coated with an adhesive surface 52 which is activatable by the application of ultrasonic energy generated by the vibration of stylus head 40. As the wire passes beneath rod 54 of ultrasonic stylus 40, ultrasonic energy is applied to activate the adhesive layer on the circuit board and to guide the wire in place in adhesive. A general description of this scribing method is given in U.S. Pat. No. 4,641,773 (Morino et al., 1987).

As depicted in FIG. 2 the two capacitors created are ground plane 56, insulator 50, and scribed wire 58, and feeding wire 12 and brass tube conductor 16.

Instead of measuring the net capacitance, as described in FIG. 1, it is also possible to measure the phase shift of the system with respect to a reference A.C. source. FIG. 2 shows A.C. source 60 which generates a 500 KHz fixed amplitude reference frequency. By comparing this reference signal with a signal passed through the net capacitor of the system, a phase shift may be measured. The net capacitance of the system increases gradually as the length of the scribed wire increases on the circuit board. In the event of a broken line the net capacitance drops drastically and the phase shift generated would be out of the expected range estimated for a wire that would not have been broken. This phase shift would be measured by the broken wire detector 62 of FIG. 2.

Figure 3:
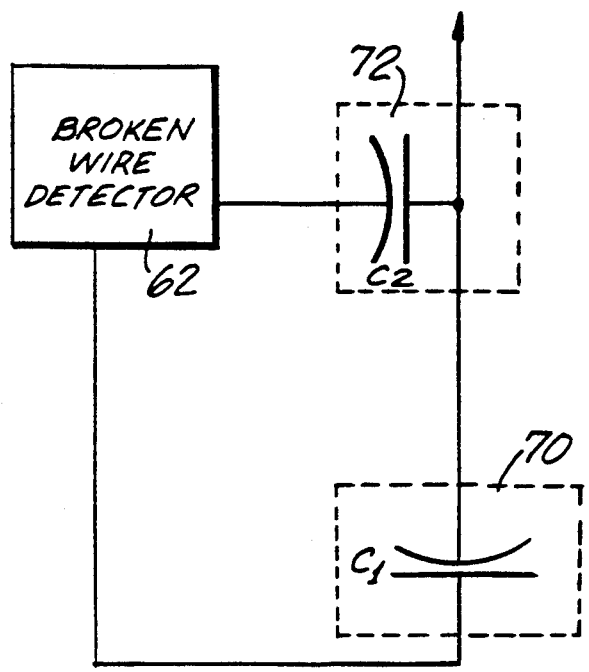
FIG. 3 is a schematic equivalent of this invention where the connection to the scribing wire is made capacitively.

FIG. 3 represents the system equivalent capacitors, $C_1$ 70 and $C_2$ 72 created by conductors and insulators as described in FIG. 2.

Figure 4:
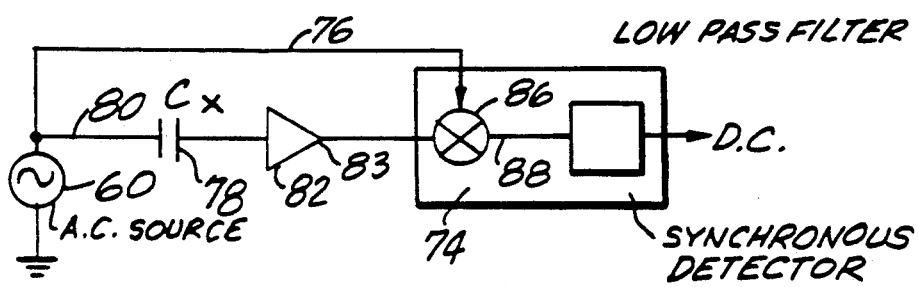
FIG. 4 is a circuit diagram of the present invention.

FIG. 4 more specifically describes a measuring means implemented in an embodiment of this invention. AC source drive 60 generates a stable frequency with a constant amplitude signal. Amplitude regulation of the output signal of the AC drive 60 is accomplished by standard closed-loop feedback techniques. The sine wave generated preferably has very low harmonic frequency content. The output of drive 60 is connected to a synchronous detector 74 by conductor 76. This output serves as a reference voltage for further comparison between the signal driven through the system capacitance 78 and the original signal itself. Hence, the output of drive 60 is also connected to the system capacitor as depicted in FIG. 2 and represented in FIG. 4. Capacitor $C_x$ 78 represents the equivalent capacitance of the system. Conductor 80 connects the output of drive 60 to capacitor $C_x$ 78. The signal driven through capacitor $C_x$ 78 experiences a phase shift, the extent of which linearly depends on the value of the capacitor $C_x$ 78. This signal is then fed into current sensitive detector 82. Current sensitive detector 82 basically consists of a low impedance amplifier. Low impedance is accomplished by the implementation of a series resonant front end within the amplifier circuitry. The input current to the current sensitive detector 82 is a linear function of unknown capacitance. Therefore, the output signal 84 is also proportional to the capacitance. The output signal 84 of the current sensitive detector 82 is connected to the input of the synchronous detector 74. The other input of the synchronous detector 74 is directly connected to the output of the source drive 60. The synchronous detector function is to simultaneously compare with gain the coinciding wave forms provided by the A.C. source 60 and the current sensitive detector 82 thus extracting the reactive portion of the signal in a linear fashion. The synchronous detector 74 contains a precision wide band width analog multiplier 86. Assuming a pure sinusoidal frequency output from drive 60, the resultant signal of the multiplication by multiplier 86 will have two frequency components. One component is a D.C. signal, the amplitude of which is a function of the capacitator phase shift, and the other is a sine wave at almost double the source frequency. By feeding the resultant signal 88 from the multiplier 86 to a low pass filter 90 the high frequency component would be attenuated to zero and the resultant output of the synchronous detector 74 will be a D.C. output signal 92 whose magnitude is proportional to capacitance $C_x$ 78 of the system.

As the length of the scribed wire increases on the circuit board, $C_x$ would also vary. It is possible to estimate the range of the capacitance $C_x$ 78 under the system's normal condition without any unscheduled wire breakage. This in turn would indicate the approximate range of the D.C. signal output 92 of the synchronous detector. Any D.C. signal outside this estimated range would indicate a function failure and proper recourses could be taken upon such an indication. The system, however, experiences an inherent capacitive effect beyond the one defined in FIG. 3. This stray capacitance would limit the available measuring range of the D.C. signals.

Figure 5:
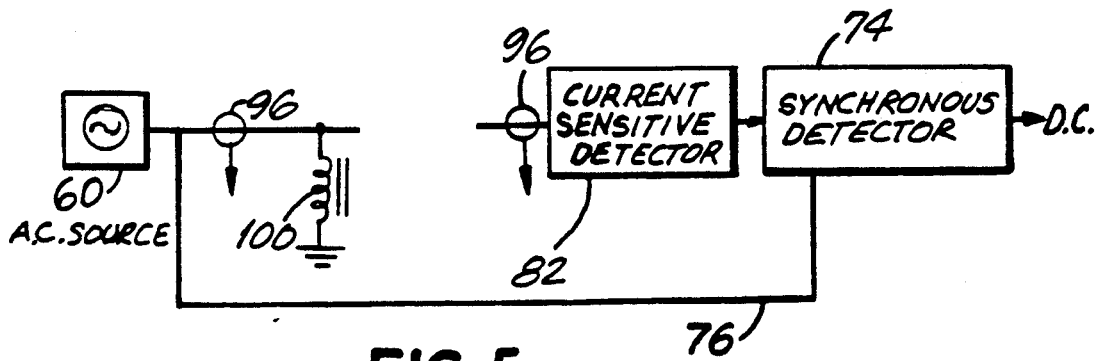
FIG. 5 is a different representation of the same circuit diagram shown in FIG. 4 with a tuning inductor.

In order to insure that all various output D.C. signals 92 are a function of defined variable Capacitor $C_x$ 78 and not a function of stray capacitors in the system a method to eliminate the effect of stray capacitance in the system is represented in FIG. 5. Inductor 100 is connected in series with stray capacitors of the system prior to engagement of the wire on the board. By tuning inductor 100 it is possible to offset the capacitive phase shift resulting from the stray capacitance by an inductive phase shift in an opposite direction. Hence, by initiating the system, the effect of the stray capacitor would be totally eliminated. The rest of the circuit depicted in FIG. 5 is similar to the circuit of FIG. 4. Current sensitive detector 82 and synchronous detector 74 perform the function described above. The D.C. voltage 92 can be used to override the scribing power signal, cut off the feeder motor, and terminate the scribing process. Connectors 96 allow for connecting the measuring system to the scribing apparatus.

Figure 6:
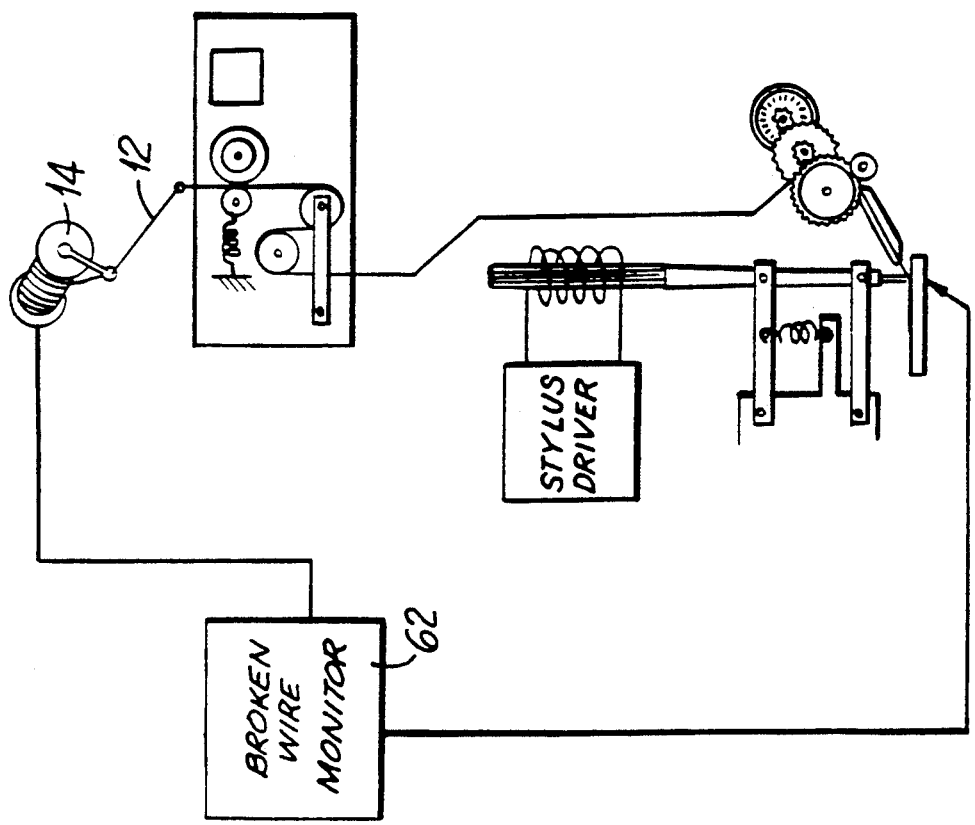
FIG. 6 shows another embodiment of the present invention where the connection to the scribing wire is made directly to the wire inside the spool.

FIG. 6 represents another embodiment of the present invention. In this embodiment the working spool 14 is wound so that the inside end of the wire 12 is exposed and one side of the broken wire monitor 62 can be directly connected to it. The other input of the broken wire monitor 62 is connected to either a shuttle plate 28 of FIG. 1 or a ground plate 27 in the panel in FIG. 1.

Figure 7:
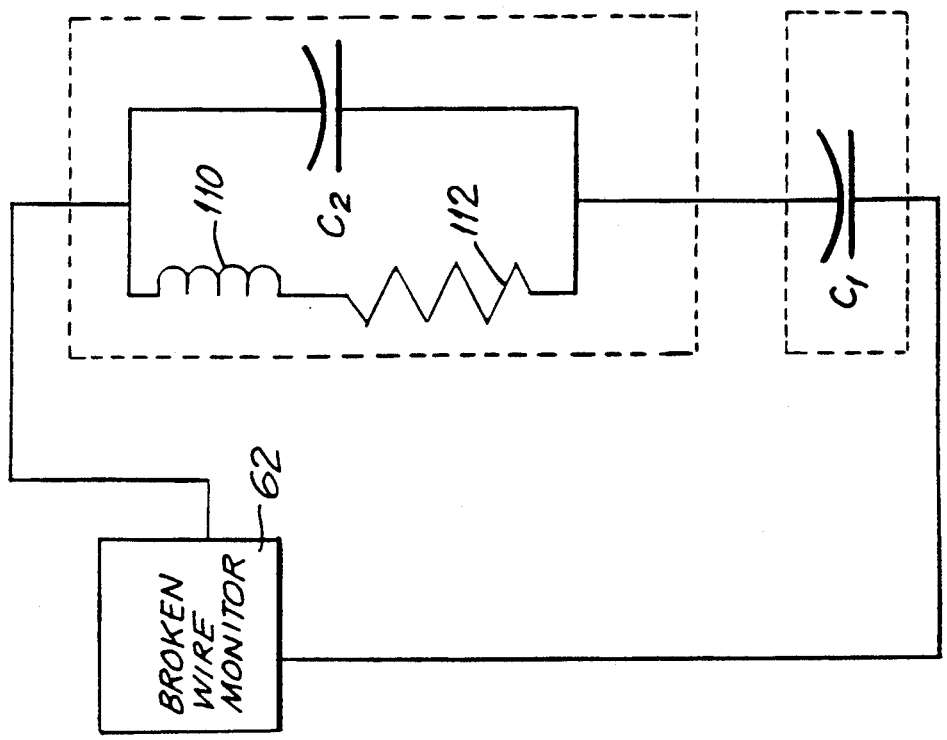
FIG. 7 is a schematic equivalent of the present invention represented by FIG. 6.

FIG. 7 represents the electrical equivalent of the system using the wire termination method of FIG. 6. The inductance 110 and resistance 112 represent the winding on spool 14 of FIG. 6.

Although only a few embodiments have been described in detail, there are numerous variations within the scope of the invention. The terms and expressions which have been used are terms of description and not terms of limitation. There is no intention to use the terms or expressions to exclude any equivalents of features shown and described or portions thereof.

We claim:

1. A broken wire detector for use on wire scribing machines comprising:

scribing means for applying and bonding wire to a workpiece;

a variable frequency signal generating means, said generating means having a first and second output conducting a signal while said wire is being scribed on the workpiece, the first output of the generating means connected to a conductive plate of said wire scribing machine upon which a workpiece being scribed with wire by said scribing means is placed;

a current detecting means for detecting a current in the work while said wire is being scribed on the workpiece, input of the detecting means being connected to the scribing wire by capacitive contacting means; and a synchronous detecting means having a first and a second input, the first input being connected to the second output of the signal generating means, the second input being connected to the output of the current detecting means, the synchronous detecting means generating a varying D.C. voltage, while said wire is being scribed, amplitude of which is a function of signals conducted into the first and the second input of the synchronous detecting means.

2. A broken wire detector, as recited in claim 1, wherein the variable frequency signal generating means is an A.C. signal generator.

3. A broken wire monitor, as recited in claim 2, further comprising:

a tuning inductive means connected to the A.C. signal generator for tuning prior to scribing the wire on the workpiece.

4. A broken wire detector, as cited in claim 3, wherein the tuning inductive means is a variable inductor with a first and a second contact, the first contact connected to the output of the A.C. signal generator and the second contact connected to ground.

5. A broken wire detector for use on wire scribing machines, as recited in claim 1, wherein the conductive plate is a ground panel on which the workpiece rests.

6. A broken wire detector, as recited in claim 1, wherein the conductive plate is a shuttle plate on which the workpiece moves.

7. A broken wire detector, as recited in claim 1, wherein the capacitive contact means between the wire and the input of the detecting means
includes the scribing wire passed through an externally conductive tube, said conductive tube being internally insulated, the outside of said conductive tube being connected to the input of the detecting means.

8. A broken wire detector, as recited in claim 1, wherein the capacitive contact means between the wire and the input of the detecting means further comprises:
a working spool for dispensing wire, wherein the input of the current detecting means is connected to an inside end of the wire.

9. A broken wire detector for use on wire scribing machine comprising:
a wire scribing means for applying and bonding wire to a workpiece; and
a capacitance measuring means for measuring a varying capacitance while said wire is being scribed, said capacitance measuring means having a first and a second probe, the first probe coupled to the wire by a capacitive contacting means, the second probe coupled to a conductive plate upon which the workpiece is located.

10. A broken wire detector, as recited in claim 9, wherein the wire scribing means is a scribing machine capable of positioning and affixing the wire in a predetermined location on a workpiece.

11. A broken wire detector, as recited in claim 9, wherein the conductive plate is a ground panel on which a workpiece rests.

12. A broken wire detector, as recited in claim 9 wherein the conductive plate is a shuttle plate on which the work piece moves.

13. A broken wire detector, as recited in claim 9, wherein the capacitive contact means between the wire and the input of the capacitance measuring means
includes the scribing wire passed through an externally conductive tube, said conductive tube being internally insulated, said conductive tube being connected to the first probe of the capacitance measuring means.

14. A broken wire detector, as recited in claim 9, wherein the capacitive contact means between the wire and the input of the capacitance measuring means further comprises:
a working spool for dispensing wire, wherein the first probe of the capacitance measuring means is connected to an inside end of the wire.

15. A process for detecting breaks in wire being scribed by a scribing means, comprising the steps of:
electrically connecting a measuring means to the wire being scribed for measuring the wire's electrical characteristics while the wire is being scribed;
connecting the measuring means to a ground plate of the scribing means;
measuring the electrical characteristics of the wire as it is being scribed; and
detecting change in the wire's electrical characteristics.

16. The process as recited in claim 15, wherein the electrical connection is a conductive tube connected directly to the measuring means and in which the scribing wire passes through the tube.

17. The process, as recited in claim 15, wherein the wire's measured electrical characteristic is capacitance.

18. The process, as recited in claim 15, wherein the measuring means is a capacitance meter.

19. The process, as recited in claim 15, wherein the wire's measured electrical characteristic is phase change.

20. The process, as recited in claim 18, wherein the electrical connection comprises:
a working spool for dispensing a winding scribing wire, wherein an inside end of the scribing wire is connected to the measuring means.

* * * * *